US012699410B2

(12) United States Patent
Owen

(10) Patent No.: US 12,699,410 B2
(45) Date of Patent: Aug. 4, 2026

(54) SOURCE/SINK LDO WITH REDUCED DEAD BAND

(71) Applicant: Renesas Electronics America Inc., Milpitas, CA (US)

(72) Inventor: Richard Todd Owen, Milpitas, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 191 days.

(21) Appl. No.: 18/794,271

(22) Filed: Aug. 5, 2024

(65) Prior Publication Data

US 2026/0037013 A1     Feb. 5, 2026

(51) Int. Cl.
*G05F 1/575*     (2006.01)
*G05F 1/595*     (2006.01)
*H03F 3/45*     (2006.01)

(52) U.S. Cl.
CPC .............. *G05F 1/575* (2013.01); *G05F 1/595* (2013.01); *H03F 3/45085* (2013.01); *H03F 3/45475* (2013.01); *H03F 2200/129* (2013.01); *H03F 2203/45028* (2013.01); *H03F 2203/45096* (2013.01)

(58) Field of Classification Search
CPC ...... G05F 1/575; G05F 1/595; H03F 3/45085; H03F 3/45475; H03F 2200/129; H03F 2203/45028; H03F 2203/45096
See application file for complete search history.

(56) References Cited

U.S. PATENT DOCUMENTS

RE41,599 E  *  8/2010  Isham  ................... H02M 3/156
                                                           327/539
2007/0126408 A1*  6/2007  Sakai  ...................... G05F 1/618
                                                           323/274
2025/0328157 A1*  10/2025  Gupta  ..................... G05F 1/575

* cited by examiner

*Primary Examiner* — Gary L Laxton
(74) *Attorney, Agent, or Firm* — SCULLY, SCOTT, MURPHY & PRESSER, P.C.

(57) ABSTRACT

A source/sink LDO is provided with a pre-amplifier that pre-amplifies an error voltage equaling a difference between an output voltage and a reference voltage. The resulting pre-amplification reduces the dead band for the source/sink LDO by the gain of the pre-amplifier.

20 Claims, 4 Drawing Sheets

SOURCE/SINK LDO WITH REDUCED DEAD BAND

TECHNICAL FIELD

This application relates to low dropout regulators, and more particularly to a source/sink low dropout regulator (LDO) with a reduced dead band.

BACKGROUND

A source/sink LDO drives an output voltage through both a current-sourcing transistor and a current-sinking transistor. The current-sourcing transistor couples between an output node for an output voltage of the LDO and a power supply node for a power supply voltage. Should the output voltage be less than a reference voltage, the current-sourcing transistor sources current into the output node to increase the output voltage. Conversely, the current-sinking transistor couples between the output node and ground and is switched on to sink current to ground from the output node to lower the output voltage should the output voltage be greater than the reference voltage. There is thus a path to ground through the current-sourcing transistor and the current-sinking transistor should both transistors be conducting.

An error amplifier drives the gates of the sourcing and sinking transistors responsive to a difference or error between the output voltage and the reference voltage. To prevent a cross-conduction condition in which both transistors are conducting, an offset voltage such as 5 millivolts is added to the error voltage. The offset is of opposite signs depending upon whether the error is being calculated to drive the current-sourcing transistor or to drive the current-sinking transistor. The net result of the opposing offset voltages is that a "dead band" exists in the output voltage. For example, should the load condition be such that the source/sink LDO must source current, the output voltage will not be regulated to equal the reference voltage but instead will be regulated to equal the reference voltage plus the offset voltage as the sourcing of current reduces to zero. Similarly, should the load condition require the source/sink LDO to sink current, the output voltage will not be regulated to equal the reference voltage but instead will be regulated to equal the reference voltage minus the offset voltage as the sinking of current reduces to zero. There is thus a dead band of approximately twice the offset voltage for the output voltage as the LDO transitions from the sinking of current to the sourcing of current and vice versa. The resulting dead band is undesirable for applications that need the output voltage to be more tightly regulated.

SUMMARY

In accordance with an aspect of the disclosure, a source/sink LDO, is provided that includes: an output node for an output voltage; a first transistor coupled between the output node and a power supply node for a power supply voltage; a second transistor coupled between the output node and ground; a pre-amplifier configured to amplify an error signal to form a pre-amplified error signal, wherein the error signal equals a difference between the output voltage and a reference voltage; and an error amplifier configured to drive a gate of the first transistor and to drive a gate of the second transistor responsive to the pre-amplified error signal and an offset voltage.

In accordance with another aspect of the disclosure, a method of operating a source/sink LDO is provided that includes: pre-amplifying a difference between an output voltage and a reference voltage to provide a differential pre-amplified voltage; driving a gate of a first transistor coupled between an output node for the output voltage and a power supply node for a power supply voltage responsive to a negative of the differential pre-amplified voltage minus an offset voltage; driving a gate of a second transistor coupled between the output node and ground responsive to the differential pre-amplified voltage minus the offset voltage.

In accordance with yet another aspect of the disclosure, a source/sink LDO is provided that includes: a pre-amplifier configured to pre-amplify an error voltage into a pre-amplified error voltage having a positive component and a negative component; an offset voltage circuit configured to subtract an offset voltage from the negative component to form a first voltage and to add the offset voltage to the negative component to form a second voltage; a first differential amplifier configured to amplify a difference between the first voltage and the positive component; and a second differential amplifier configured to amplify a difference between the positive component and the second voltage.

These and other aspects of the invention will become more fully understood upon a review of the detailed description, which follows. Other aspects, features, and implementations will become apparent to those of ordinary skill in the art, upon reviewing the following description of specific, exemplary implementations in conjunction with the accompanying figures. While features may be discussed relative to certain implementations and figures below, all implementations can include one or more of the advantageous features discussed herein. In other words, while one or more implementations may be discussed as having certain advantageous features, one or more of such features may also be used in accordance with the various implementations discussed herein. In similar fashion, while exemplary implementations may be discussed below as device, system, or method implementations, it should be understood that such examples can be implemented in various devices, systems, and methods.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

To prevent a cross-conduction condition in which both the current-sourcing transistor and the current-sinking transistor are conducting, source/sink LDOs typically employ an offset voltage in addition to an error voltage. The error voltage equals the difference between an output voltage of the source/sink LDO and a reference voltage. With respect to driving the current-sourcing transistor, the source/sink LDO uses the difference between the opposite of error voltage and the offset voltage. The result of this subtracting of the offset voltage is that output voltage is not regulated to equal the reference voltage as the sourcing of current from the current-sourcing transistor reduces to zero but instead is regulated to equal the reference voltage plus the offset voltage. Conversely, the source/sink LDO uses the difference between the error voltage and the offset voltage to drive the current-sinking transistor. This causes the output voltage to be regulated to equal the reference voltage minus the offset voltage as the sinking of current from the current-sinking transistor reduces to zero. The result is that the output voltage regulation has a dead band about the reference voltage in that the output voltage is never regulated to equal the reference voltage but instead is either too high by the offset voltage or too low by the offset voltage. The dead band is thus approximately twice the offset voltage in a traditional source/sink LDO.

To substantially reduce the dead band, an improved source/sink LDO is provided that includes a fully differential pre-amplifier that pre-amplifies the error voltage equaling the difference between the output voltage and the reference voltage. A difference between a positive component and a negative component of the differential output voltage from the pre-amplifier thus equals a product of the (error voltage) $*A_v$, where $A_v$ is the gain of the pre-amplifier. The error amplifier of the source/sink amplifier then drives the current-sourcing transistor with respect to a difference between the sum of the negative of the (error voltage) $*A_v$ and the offset voltage and drives the current-sinking transistor with respect to a difference between the error voltage $*A_v$ and the offset voltage (Vos). It will be shown herein that the dead band is reduced to $2*Vos/A_v$. For example, if the offset voltage is 5 mV and the gain $A_v$ is ten, then the dead band is approximately 1 mV. For a typical output voltage such as 0.75V, the dead band is thus substantially less than one percent of the output voltage. The pre-amplification of the error voltage prior to the offset voltage addition/subtraction thus results in a much-improved regulation of the output voltage.

Figure 1:
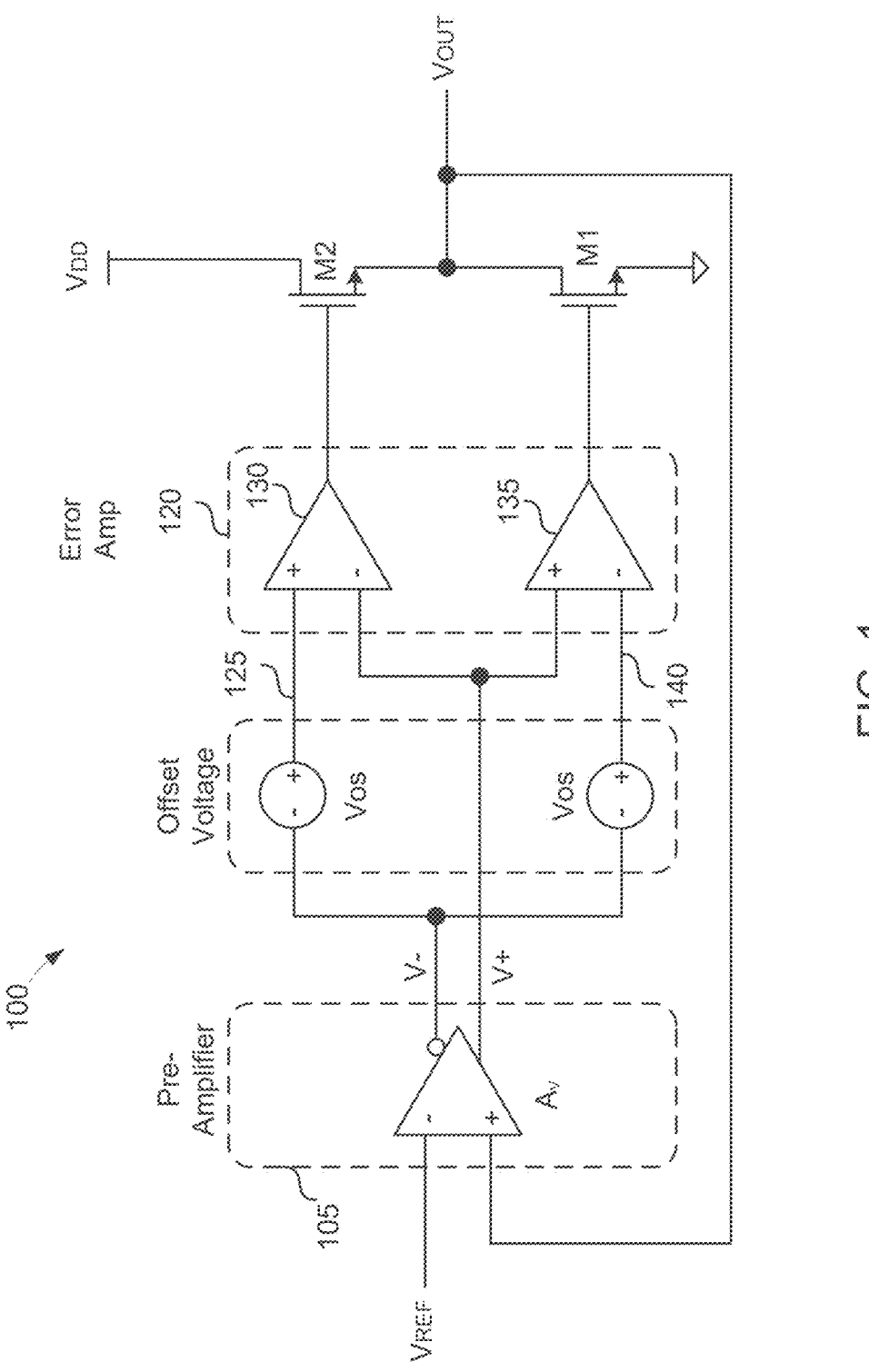
FIG. 1 illustrates a source/sink LDO in accordance with an aspect of the disclosure.

An example source/sink LDO 100 is shown in FIG. 1. An n-type metal-oxide semiconductor (NMOS) transistor M2 functions as the current-sourcing transistor. The current-sourcing transistor M2 has a drain coupled to a node for a power supply voltage VCC and a source coupled to an output node for an output voltage Vout. The current-sourcing transistor M2 is also denoted herein as a first transistor. Another NMOS transistor M1 functions as the current-sinking transistor and has a drain coupled to the output node and a source coupled to ground. The current-sinking transistor M1 is also denoted herein as a second transistor.

The output node for the output voltage Vout also couples to a non-inverting input terminal of a fully differential pre-amplifier 105 that receives a reference voltage Vref at its inverting input terminal. The pre-amplifier 105 produces a differential output voltage having a positive component V+ and a negative component V−. A difference between V+ and V− equals a product of the error voltage (Vout−Vref) and the gain $A_v$. An offset voltage circuit 110 subtracts an offset voltage Vos from negative component V− to form a first offset signal 125 that equals (V−)−Vos. An error amplifier 120 includes a first differential amplifier 130 that receives the first offset signal 125 at its non-inverting input terminal and receives the positive component V+ at its inverting input terminal. An output terminal of the first differential amplifier 130 couples to the gate of the current-sourcing transistor M2.

Feedback through the first differential amplifier 130 as the current-sourcing transistor M2 sources current into the output node will thus force V+ to equal (V−)−Vos. This expression may be rewritten as (V+)−(V−)=−Vos. Since (V+)−(V−) equals (Vout−Vref) $*A_v$, the equation (V+)−(V−) =−Vos may be rewritten as (Vout−Vref)=−Vos/$A_v$. Thus, the feedback through the first differential amplifier 130 regulates the output voltage Vout such that a sum of Vout with Vos/$A_v$ equals Vref as the sourcing current conducted through the current-sourcing transistor M2 drops towards zero.

Feedback through a second differential amplifier 135 having an output terminal coupled to the gate of the current-sinking transistor M1 is analogous. With regard to this feedback, the offset voltage circuit 110 adds the offset voltage to the negative component V− to form a second offset signal 140 that equals (V−)+Vos. The second differential amplifier 135 receives the second offset signal 140 at its inverting input terminal and receives the positive component V+ at its non-inverting input terminal. Feedback through the second differential amplifier 135 as the current-sinking transistor M1 sinks current from the output node will thus force V+ to equal (V−)+Vos. This expression may be rewritten as (V+)−(V−)=Vos. Since (V+)−(V−) equals (Vout−Vref) $*A_v$, the equation (V+)−(V−)=Vos may be rewritten as (Vout−Vref)=Vos/$A_v$. Thus, the feedback through the first differential amplifier 130 regulates the output voltage Vout as the sinking current conducted through the current-sinking transistor M1 drops towards zero such that Vout−Vos/$A_v$ equals Vref. Source/sink LDO 100 thus tightly regulates the output voltage Vout with a dead band of approximately $2*Vos/A_v$. Such improved regulation of the output voltage of a source/sink LDO has numerous applications. For example, the source/sink LDO 100 may be used to regulate a termination node voltage of a double data rate (DDR) memory.

Figure 2:
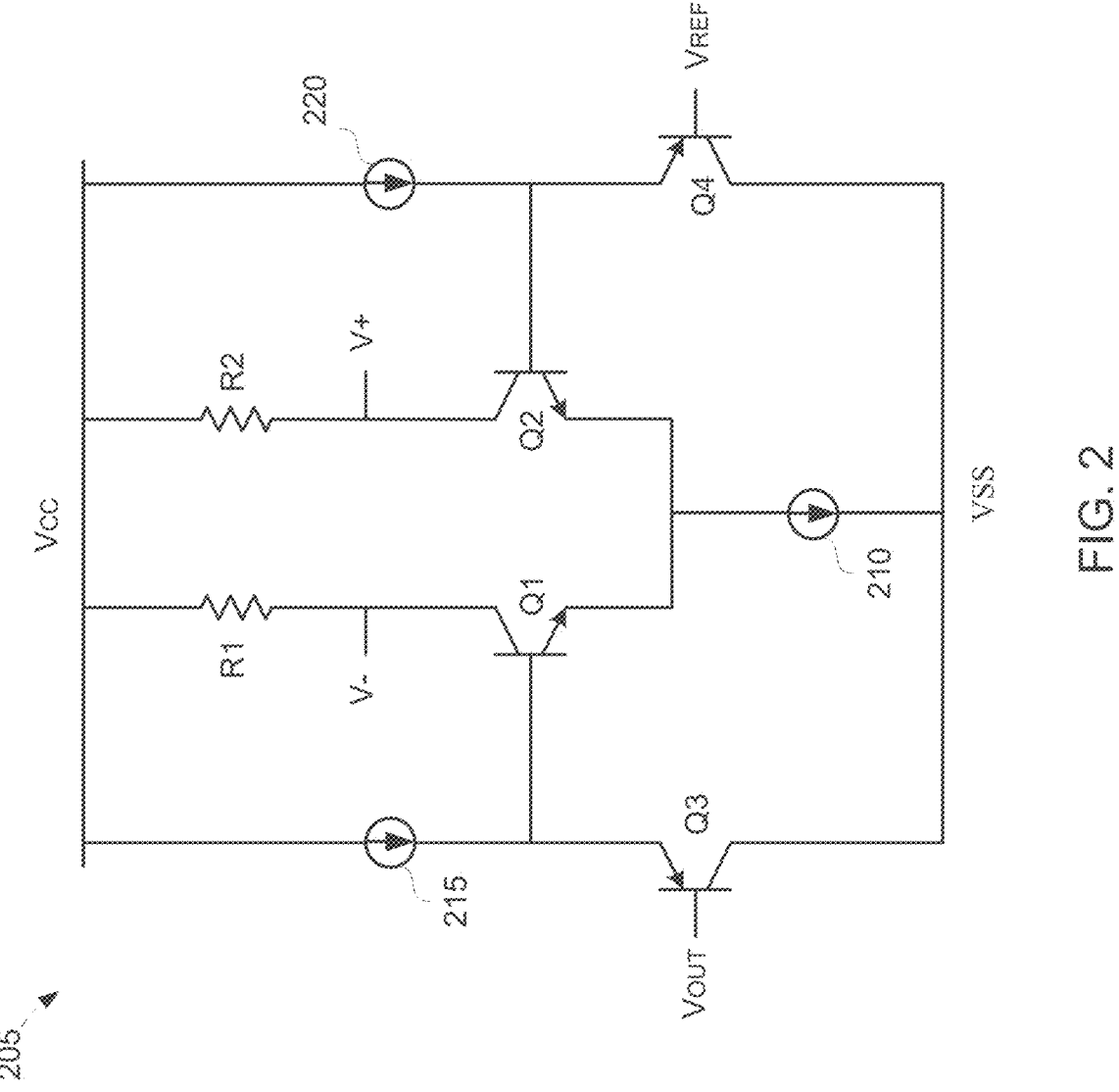
FIG. 2 is a circuit diagram of an example pre-amplifier implementation for a source/sink LDO in accordance with an aspect of the disclosure.

Example implementations of the pre-amplifier 105, the offset voltage circuit 110, and the error amplifier 120 will now be discussed in more detail. An example pre-amplifier 205 is shown in FIG. 2. A differential pair of transistors such as a pair of NPN bipolar junction transistors Q1 and Q2 steer a tail current from a current source 210 responsive to a difference between the output voltage Vout and the reference voltage Vref. Since the base-to-emitter voltage (VBE) for NPN bipolar junction transistors can be around 0.7V in some implementations, the output voltage Vout and the reference voltage Vref would each have to satisfy this minimum value to keep the transistors Q1 and Q2 operating in the active region if these voltages directly coupled to their base terminals. To provide a greater input voltage range for the pre-amplifier 205, the output voltage Vout couples to a base of a PNP bipolar junction transistor Q3 having a collector coupled to ground (VSS). A current source 215 couples between the emitter of the transistor Q3 and a node for the power supply voltage VCC to maintain the operation of the transistor Q3 in the active region. The emitter of the transistor Q3 couples to the base of the transistor Q1 and will be a VBE voltage higher than the output voltage Vout. In this fashion, the output voltage Vout may have a wider input range as compared to a direct drive of the output voltage Vout on the base of the transistor Q1.

Similarly, the reference voltage Vref couples to a base of a PNP bipolar junction transistor Q4 having a collector coupled to ground (VSS). A current source 220 couples between the emitter of the transistor Q4 and the node for the power supply voltage VCC to maintain the operation of the transistor Q4 in the active region. The emitter of the transistor Q4 couples to the base of the transistor Q2 and will be a VBE voltage higher than the reference voltage Vref. In this fashion, the reference voltage Vref may have a wider input range as compared to a direct drive of the reference voltage Vref on the base of the transistor Q1.

As the output voltage Vout rises above the reference voltage Vref, the tail current from the current source 210 will swing to be conducted virtually exclusively by transistor Q1 as compared to transistor Q2. The collector voltage of transistor Q1 will thus discharge whereas the collector voltage of transistor Q2 will charge towards the power supply voltage VCC. To develop the negative component V− of the differential output voltage from the pre-amplifier 205 at the collector of the transistor Q1, the collector of the transistor Q1 couples to the power supply node through a resistor R1. Similarly, as the reference voltage Vref rises above the output voltage Vout, the tail current will swing to be conducted virtually exclusively by the transistor Q2, which causes the collector voltage of transistor Q2 to discharge whereas the collector voltage of transistor Q1 will charge towards the power supply voltage VCC. To develop the positive component V+ of the differential output voltage from the pre-amplifier 205 at the collector of the transistor Q2, the collector of the transistor Q2 couples to the power supply node through a resistor R2 having a matched resistance to the resistor R1.

Figure 3A:
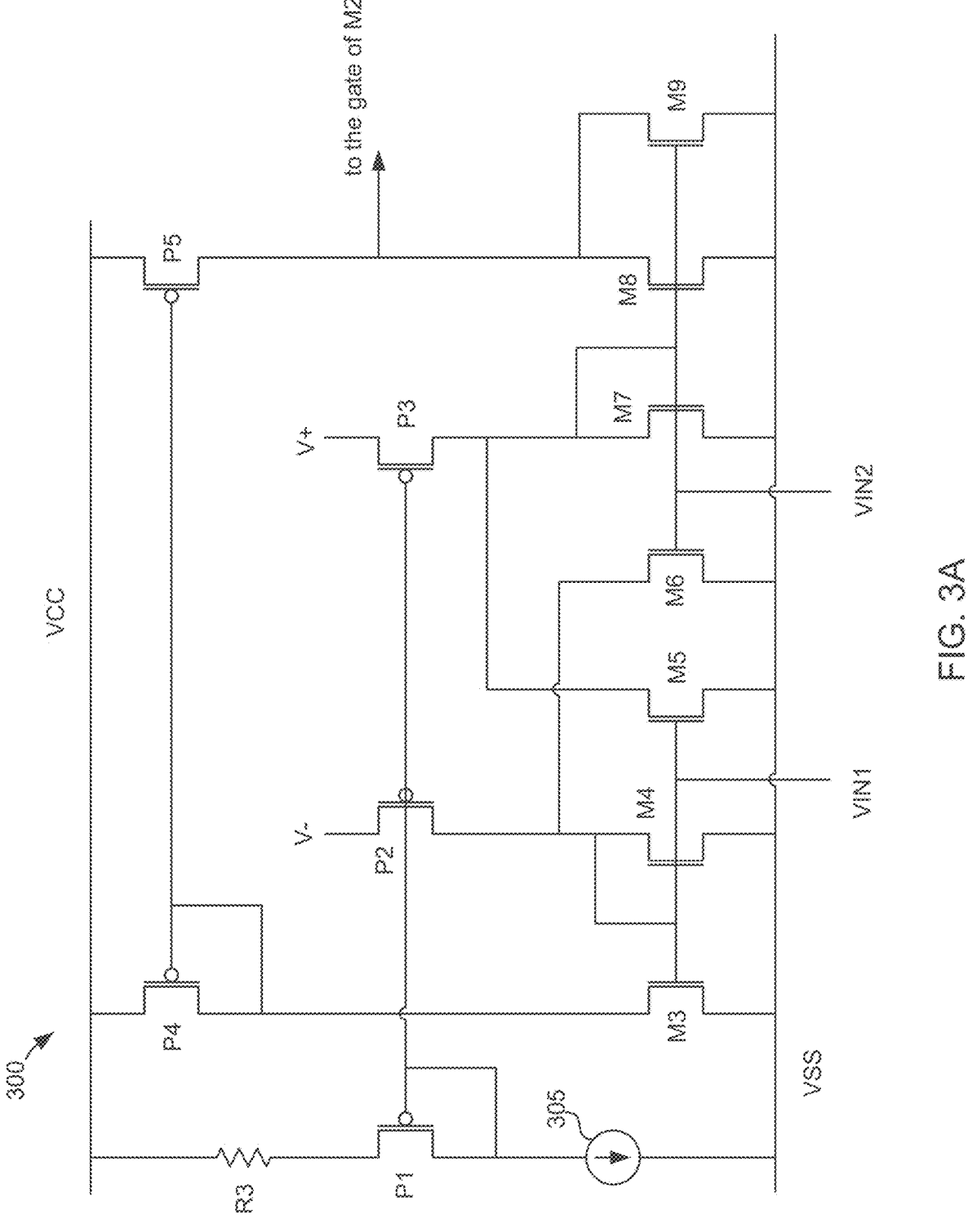
FIG. 3A is a circuit diagram of a first portion of an error amplifier for a source/sink LDO in accordance with an aspect of the disclosure.
Figure 3B:
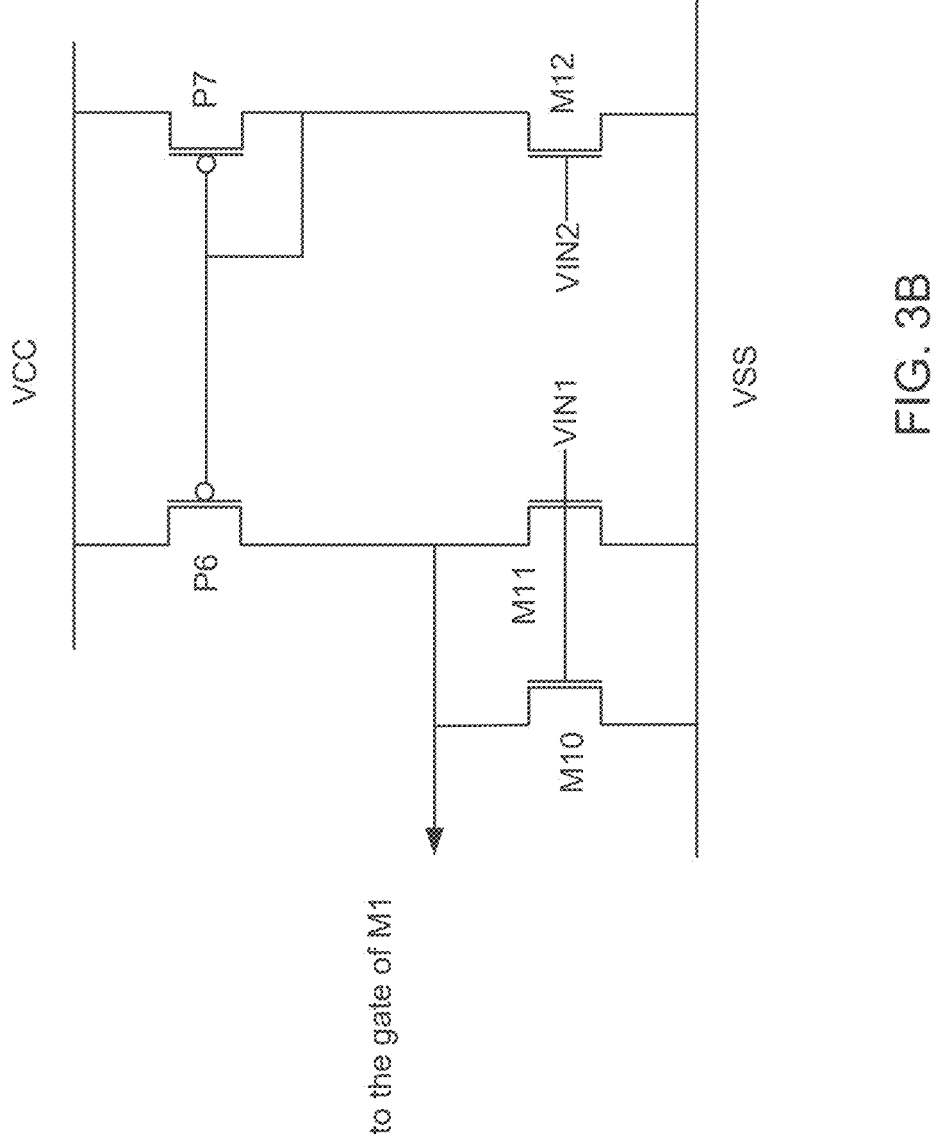
FIG. 3B is a circuit diagram of a second portion of an error amplifier for a source/sink LDO in accordance with an aspect of the disclosure.

It will be appreciated that the pre-amplifier 205 may instead be constructed using MOSFETs in alternative implementations. An example error amplifier 300 is shown in FIG. 3A (and in FIG. 3B) that inherently includes the offset voltage circuit 110. A pair of p-type metal-oxide semiconductor (PMOS) cascode transistors P2 and P3 are biased by a diode-connected PMOS transistor P1 having a drain and gate coupled to ground through a current source 305. The current conducted by the current source 305 is also conducted by the transistor P1 to maintain active operation of the transistor P1. A source of the transistor P1 couples to the power supply node through a resistor R3. The gate and drain of the transistor P1 couple to the gates of the cascode transistors P2 and P3 to bias them. The source of the cascode transistor P2 couples to a node for the negative component V− of the differential output voltage from the pre-amplifier 205. Similarly, the source of the cascode transistor P3 couples to a node for the positive component V+. The drain of the cascode transistor P2 couples to a drain and gate of a diode-connected n-type metal-oxide semiconductor (NMOS) transistor M4 that has its source coupled to ground (VSS). In the same fashion, the drain of the cascode transistor P3 couples to a gate and a drain of a diode-connected NMOS transistor M7 having a source coupled to ground. Transistor M4 is also denoted herein as a first diode-connected transistor. Similarly, transistor M7 is also denoted herein as a second diode-connected transistor.

The gate of the diode-connected transistor M4 couples to a gate of an NMOS transistor M3 that also has its source coupled to ground. Transistor M3 will thus substantially mirror the current conducted by transistor M4. Transistor M3 is thus also denoted herein as a first current-mirror transistor. The gate of the diode-connected transistor M7 couples to a gate of an NMOS transistor M8 having a source coupled to ground. Transistor M8 will thus substantially mirror the current conducted by transistor M7. Transistor M8 is thus also denoted herein as a second current-mirror transistor.

A drain of the transistor M3 couples to a drain and a gate of a diode-connected PMOS transistor P4 having a source coupled to the power supply node for the power supply voltage VCC. A gate (and also the drain) of the transistor P4 couples to a gate of a PMOS transistor having a source coupled to the power supply node and a drain coupled to the drain of transistor M8. Transistors P4 and P5 form a first current mirror. The drains of transistors P5 and M8 couple to the gate of the current-sourcing transistor M2 in the source/sink LDO 100.

Suppose that the output voltage Vout is greater than the reference voltage Vref to cause the positive component V+ to be greater than the negative component V−. The resulting conduction of current by the cascode transistor P3 also conducts through transistor M7, which causes the drain of transistor M8 to discharge towards ground. Since the cascode transistor P2 will conduct relatively little current with V+ being greater than V−, there is a correspondingly small amount of current conducted by transistor M4. In turn, transistor M3 conducts relatively little, which causes transistor P4 to conduct relatively little current. Since transistors P4 and P5 are in a current mirror relationship, transistor P5 will also conduct relatively little current to not struggle with transistor M8 discharging its drain. The discharge of the drains of transistors P5 and M8 thus forces the current-sourcing transistor M2 to stop conducting, which is what is desired given that it was assumed that the output voltage Vout is greater than the reference voltage Vref.

Should the reference voltage Vref be greater than the output voltage Vout, then the negative component V-will be greater than the positive component V+ to cause the cascode transistor P2 to conduct more than the cascode transistor P3. The resulting conduction through transistor M4 causes transistors M3 and P4 to conduct, which in turn causes transistor P5 to conduct to begin charging the drain of transistors P5 and M8. Since the cascode transistor P3 is conducting relatively little current, transistor M7 also conducts this relatively small amount of current. Transistor M8 mirrors this relatively small (or no) amount of current to not struggle with the charging of the drains of transistors P5 and M8. The gate voltage of the current-sourcing transistor M2 will thus increase to source current into the node for the output voltage Vout, which is what is desired given that it was assumed that the reference voltage was greater than the output voltage Vout.

To increase the gain, the error amplifier 300 may include a pair of cross-coupled NMOS transistors M5 and M6 each having a source coupled to ground. The drain of transistor M5 couples to the drain of the cascode transistor P3 whereas the gate of transistor M5 couples to the gate of transistor M4 and to the gate of transistor M3. Similarly, the drain of the transistor M6 couples to the drain of the cascode transistor P2 whereas its gate couples to the gate of the transistor M7 and to the gate of the transistor M8. Suppose that the cascode transistor P2 is conducting more current than the cascode transistor P3 due to the positive component V+ being greater than the negative component V−, which causes the transistor M4 to conduct. Transistor M4 is in a current mirror relationship with the transistor M5 such that the transistor M5 also conducts to help discharge the drain of the cascode transistor P3 to more firmly switch off the transistors M7 and M8. Conversely, if the cascode transistor P3 conducts more current than the cascode transistor P2 due to the negative component V-being greater than the positive component V+, then the transistor M7 will also conduct. Transistor M6 is in a current mirror relationship with transistor M7 and will thus conduct to help discharge the drain of the cascode transistor P2 to more firmly switch off the transistors M3 and M4.

With respect to the drains of the cascode transistors P2 and P3, it may be observed that the transistors M3, M4, M5, M6, M7, and M8 are symmetrically arranged. But it is desired that the drive of the gate of the current-sourcing transistor M2 be reduced by the offset voltage to prevent a cross-conduction condition. To provide this additional offset, another NMOS transistor M9 has its source coupled to ground and a drain coupled to the drain of the transistor M8. A gate of the transistor M9 couples to the gate of the transistors M8, M7, and M6. A discharge of the gate of current-sourcing transistor M2 is thus accentuated as compared to the charging of the gate voltage to provide the desired subtraction of the offset voltage to the gate drive of the current-sourcing transistor M2. Alternatively, transistor M8 may have a larger size than transistor M3 to provide the desired asymmetry between the discharging and charging of the gate voltage of the current-sourcing transistor M2.

The gates of the transistors M3, M4, and M5 form a node for an internal voltage Vin1. Similarly, the gates of the transistors M6, M7, M8, and M9 form a node for an internal voltage Vin2. The driving of the gate voltage of the current-sinking transistor M1 by the error amplifier 300 with respect to the internal voltages Vin1 and Vin2 will now be discussed with reference to FIG. 3B. The voltage Vin1 drives a gate of an NMOS transistor M11 having a source coupled to ground. Similarly, the voltage Vin2 drives a gate of an NMOS transistor M12 having a source coupled to ground. The drain of the transistor M12 couples to a gate and a drain of a diode-connected PMOS transistor P7 having a source coupled to the power supply node for the power supply voltage VCC. The gate and drain of the diode-connected transistor P7 also couple to the gate of a PMOS transistor P6 having a source coupled to the power supply node. Transistors P7 and P6 thus form a second current mirror analogous to transistors P4 and P5. A drain of the transistor P6 couples to the drain of the transistor M11. Transistor M11 is also denoted herein as a third transistor. Similarly, transistor M12 is also denoted herein as a fourth transistor.

As discussed with respect to FIG. 3A, if the output voltage Vout is greater than the reference voltage Vref, the cascode transistor P3 will conduct more than the cascode transistor P2, which charges the voltage Vin2 and tends to discharge the voltage Vin1. Transistor M12 will then conduct a current to discharge its drain whereas transistor M11 will conduct less. The current conducted by the transistor M12 also conducts through transistor P7, which causes transistor P6 to conduct a mirrored current into its drain. The drains of the transistors P6 and M11 will thus be charged towards the power supply voltage VCC in response to Vin2 being greater than Vin1. The drains of the transistors P6 and M11 couple to the gate of the current-sinking transistor M1. The current-sinking transistor M1 will thus sink current from the node for the output voltage Vout, which is what is desired in response to the output voltage Vout being too high as compared to the reference voltage Vref. Conversely, if Vin1 is greater than Vin2 in response to Vout being less than Vref, the transistor M11 will conduct a current whereas transistor M12 will conduct less. The drains of the transistors P6 and M11 will thus be discharged towards ground to switch off the current-sinking transistor M1 in response to the output voltage being too low.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

I claim:

1. A source/sink LDO, comprising:
   an output node for an output voltage;
   a first transistor coupled between the output node and a power supply node for a power supply voltage;
   a second transistor coupled between the output node and ground;
   a pre-amplifier configured to amplify an error signal to form a pre-amplified error signal, wherein the error signal equals a difference between the output voltage and a reference voltage; and
   an error amplifier configured to drive a gate of the first transistor and to drive a gate of the second transistor responsive to the pre-amplified error signal and an offset voltage.

2. The source/sink LDO of claim 1, wherein the first transistor and the second transistor each comprises a NMOS transistor.

3. The source/sink LDO of claim 1, wherein the pre-amplifier is a fully differential pre-amplifier, and wherein the pre-amplified error signal is a differential pre-amplified error signal having a positive component and a negative component.

4. The source/sink LDO of claim 3, wherein the pre-amplifier comprises:
   a first current source; and
   a differential pair of transistors configured to steer a current from the first current source responsive to the difference between the output voltage and the reference voltage.

5. The source/sink LDO of claim 4, wherein the differential pair of transistor comprises:
   a first bipolar junction transistor having an emitter coupled to the first current source and a collector coupled to the power supply node through a first resistor; and
   a second bipolar junction transistor having an emitter coupled to the first current source and a collector coupled to the power supply node through a second resistor.

6. The source/sink LDO of claim 5, wherein the pre-amplifier further comprises:
   a third bipolar junction transistor having a collector coupled to ground, an emitter coupled to a base of the first bipolar junction transistor, and a base coupled to an output node for the output voltage;
   a second current source coupled between the collector of the third bipolar junction transistor and the power supply node;
   a fourth bipolar junction transistor having a collector coupled to ground, an emitter coupled to a base of the second bipolar junction transistor, and a base coupled to a node for the reference voltage; and
   a third current source coupled between the collector of the fourth bipolar junction transistor and the power supply node.

7. The source/sink LDO of claim 5, wherein the error amplifier comprises:
   a first cascode transistor having a first terminal coupled to the collector of the first bipolar junction transistor;

a first diode-connected transistor coupled between a second terminal of the first cascode transistor and ground;

a first current-mirror transistor configured to mirror a current conducted by the first diode-connected transistor;

a second cascode transistor having a first terminal coupled to the collector of the second bipolar junction transistor;

a second diode-connected transistor coupled between a second terminal of the first cascode transistor and ground;

a second current-mirror transistor configured to mirror a current conducted by the second diode-connected transistor and having a terminal coupled to the gate of the first transistor; and a first current mirror configured to mirror a current conducted by the second current-mirror transistor to the gate of the first transistor.

8. The source/sink LDO of claim 7, wherein the first cascode transistor and the second cascode transistor each comprises a PMOS transistor, the first diode-connected transistor and the second diode-connected transistor each comprises a diode-connected NMOS transistor, and the first current-mirror transistor and the second current-mirror transistor each comprises a current-mirror NMOS transistor.

9. The source/sink LDO of claim 8, wherein the error amplifier further comprises an extra NMOS transistor having a gate coupled to a gate of the second diode-connected transistor, a source coupled to ground; and a drain coupled to the gate of the first transistor.

10. The source/sink LDO of claim 8, further comprising:

a first cross-coupled NMOS transistor having a source coupled to ground, a gate coupled to a gate of the first diode-connected transistor, and a drain coupled to a drain of the second cascode transistor; and a second cross-coupled NMOS transistor having a source coupled to ground, a gate coupled to a gate of the second diode-connected transistor, and a drain coupled to a drain of the first cascode transistor.

11. The source/sink LDO of claim 7, wherein the error amplifier further comprises:

a third transistor having a source coupled to ground, a gate coupled to a gate of the first diode-connected transistor; and a drain coupled to the gate of the second transistor;

a fourth transistor having a source coupled to ground and a gate coupled to a gate of the second diode-connected transistor; and a second current mirror configured to mirror a current conducted by the fourth transistor to the gate of the second transistor.

12. The source/sink LDO of claim 11, wherein the error amplifier further comprises:

an extra NMOS transistor having a source coupled to ground, a gate coupled to the gate of the first diode-connected transistor, and a drain coupled to the gate of the second transistor.

13. The source/sink LDO of claim 11, wherein the first current mirror comprises a first pair of PMOS transistors, and the second current mirror comprises a second pair of PMOS transistors.

14. A method of operation of a source/sink LDO comprising:

pre-amplifying a difference between an output voltage and a reference voltage to provide a differential pre-amplified voltage;

driving a gate of a first transistor coupled between an output node for the output voltage and a power supply node for a power supply voltage responsive to a negative of the differential pre-amplified voltage minus an offset voltage; and driving a gate of a second transistor coupled between the output node and ground responsive to the differential pre-amplified voltage minus the offset voltage.

15. The method of claim 14, wherein pre-amplifying the difference between the output voltage and the reference voltage comprises steering a tail current through a differential pair of bipolar junction transistors responsive to the difference to develop the differential pre-amplified voltage across a pair of collectors for the differential pair of bipolar junction transistors.

16. A source/sink LDO, comprising:

a pre-amplifier configured to pre-amplify an error voltage into a pre-amplified error voltage having a positive component and a negative component;

an offset voltage circuit configured to subtract an offset voltage from the negative component to form a first voltage and to add the offset voltage to the negative component to form a second voltage;

a first differential amplifier configured to amplify a difference between the first voltage and the positive component; and a second differential amplifier configured to amplify a difference between the positive component and the second voltage.

17. The source/sink LDO of claim 16, further comprising:

a first transistor coupled between a power supply node and an output node for the source/sink LDO, wherein an output terminal of the first differential amplifier is coupled to a gate of the first transistor; and a second transistor coupled between the output node for the source/sink LDO and ground, wherein an output terminal of the second differential amplifier is coupled to a gate of the second transistor.

18. The source/sink LDO of claim 17, wherein the first transistor and the second transistor each comprises an NMOS transistor.

19. The source/sink LDO of claim 17, wherein the output node for the source/sink LDO is coupled to a non-inverting input terminal of the pre-amplifier and wherein a node for a reference voltage is coupled to an inverting input terminal of the pre-amplifier.

20. The source/sink LDO of claim 17, wherein the source/sink LDO is configured to bias a termination node of a double data rate memory.

* * * * *